United States Patent [19]

Ohashi et al.

[11] Patent Number: 4,998,253
[45] Date of Patent: Mar. 5, 1991

[54] SYNDROME SEQUENTIAL DECODER

[75] Inventors: Masayoshi Ohashi, Saitama; Yutaka Yasuda, Tokyo, both of Japan

[73] Assignee: Kokusai Denshin Denwa Co., Ltd., Tokyo, Japan

[21] Appl. No.: 320,633

[22] Filed: Mar. 8, 1989

[30] Foreign Application Priority Data

Mar. 11, 1988 [JP] Japan .................................. 63-56124
Mar. 11, 1988 [JP] Japan .................................. 63-56125

[51] Int. Cl.$^5$ ............................................ G06F 11/10
[52] U.S. Cl. .................................................... 371/43
[58] Field of Search ........................ 371/43, 44, 45, 46

[56] References Cited

U.S. PATENT DOCUMENTS

| | | | |
|---|---|---|---|
| 4,669,084 | 5/1987 | Hartman et al. ....................... | 371/43 |
| 4,797,887 | 1/1989 | Yamasaki et al. ...................... | 371/43 |
| 4,853,930 | 8/1989 | Shimada ................................. | 371/43 |
| 4,878,221 | 10/1989 | Shimada ................................. | 371/43 |
| 4,905,317 | 2/1990 | Suzuki et al. .......................... | 371/43 |

OTHER PUBLICATIONS

Convolutional Codes I: Algebraic Structure, Forney, Jr., IEEE Transactions on Information Theory vol. IT-16, No. 6, Nov. 1970, pp. 720-738.
Channel Coding with Multilevel/Phase Signals, Ungerboeck, IEEE Transactions on Information Theory, vol. IT-28, No. 1, Jan. 1082, pp. 55-67.
Development of a Variable Rate Syndrome Sequential Decoder Based on a Stack Algorithm, Ohashi et al., IEEE, 1988, pp. 131-135.
IEEE Catalog No. 88 CH 2621, Abstracts of Papers, Jun. 1988.

Primary Examiner—Charles E. Atkinson
Attorney, Agent, or Firm—Armstrong, Nikaido, Marmelstein, Kubovcik & Murray

[57] ABSTRACT

A syndrome sequential decoding system for error correction of a convolutional code has a syndrome former for providing a syndrome sequence from a received sequence, a syndrome buffer memory for storing the syndrome sequence, an estimated error buffer memory for storing an estimated error sequence, a syndrome register for representing a syndrome state under searching, a comparator for testing if content of the syndrome register is all zero, and an algorithm controller. The algorithm controller controls the syndrome register, calculates a path metric and raises a flag in the estimated error buffer memory for showing an estimated error bit position. The syndrome sequential decoding system also includes an exclusive-OR circuit for correcting an information bit error according to the output of the estimated error buffer memory. When the content of the syndrome register is all zero, it shows that a currently searching path merges with the maximum likelihood path. Then a decoded sequence up to this point is explicitly determined. Moreover no further search will be required as long as the following syndromes remain zero. When the content of the syndrome register becomes nonzero, the normal path search restarts at this point. A back search limit pointer is provided on the estimated error buffer memory and a syndrome buffer memory to show the limit of the depth of back search.

9 Claims, 4 Drawing Sheets

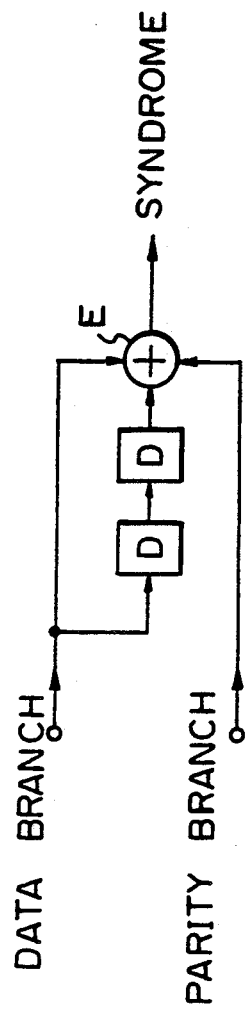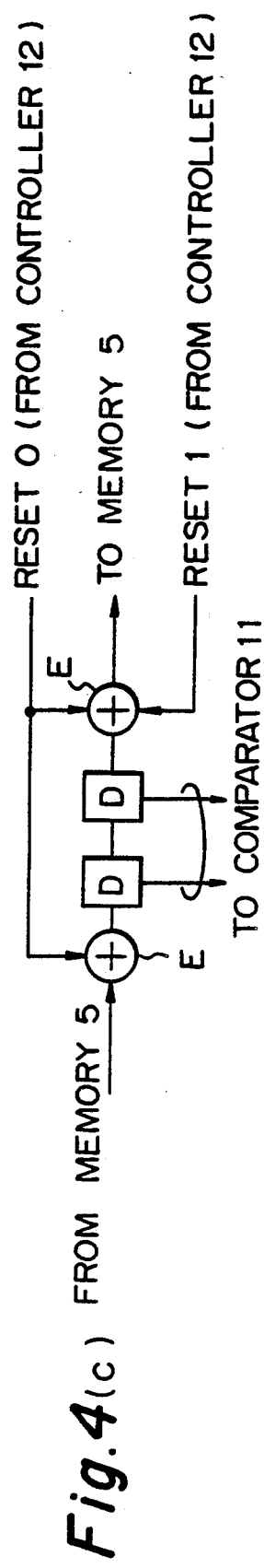
Fig.4(a)
Fig.4(b)
Fig.4(c)

SYNDROME SEQUENTIAL DECODER

BACKGROUND OF THE INVENTION

The present invention relates to an forward error correction system, and in particular, relates to such a system which encodes an information sequence using a convolutional code at the transmitting end and decodes such a sequence using sequential decoding at the receiving end.

A forward error correction (FEC) has been known as an efficient technique for removing channel errors.

There exists two major types of the code which are used for a forward error correction system. One is a block code, and the other is a convolutional code.

A block code system separates a series of information data into blocks, each of which is encoded according to a predetermined algorithm. A block code is now used mainly in the audio, video, and computer field.

In a convolutional code, information bits are encoded continuously by using shift registers and Exclusive-OR circuits, and it is used in particular in satellite communications. The present invention relates to the decoding of a convolutional code.

A convolutional code can be decoded either by Viterbi decoding or sequential decoding. The Viterbi decoding provides the maximum likelihood decoding, which attains the largest coding gain under the given constraint length. However, the Viterbi decoding has the disadvantage that the decoding complexity grows exponentially with its constraint length, so that it is difficult to decode a code with a long constraint length.

In this case, sequential decoding is used.

In sequential decoding, a tree structure of the convolutional code is used for searching a path which is considered to be the most likely locally. The decoding complexity is rather insensitive to the code constraint length, and so codes with a long constraint length are often used and can be decoded rather easily in the sequential decoding. When the channel becomes noisy, it must search many branches to find out the correct path, and so, substantial decoding effort is required. In other words, the condition of the channel affects the decoding complexity. Two well-known decoding algorithms for sequential decoding are a Fano algorithm and a stack algorithm.

In a Fano algorithm, a search pointer moves forward and backward for finding out a correct path. However, when the error rate becomes high, the number of computations for finding out a correct path increases exponentially. In this case, a search pointer sometimes goes back so far that it violates the backsearch limit, and when this happens, the decoder is considered to have reached the overflow point, and is initialized.

In the stack algorithm, a number of nodes stored in a stack memory also increases when the error rate becomes high. When that number exceeds the stack memory capacity, the stack overflow occurs, and a further path search is impossible.

As described above, a prior art sequential decoding system has the disadvantage that it takes a lot of decoding effort when in a noisy channel so that it may degrade the total bit error performance even though it can decode a convolutional code with a long constraint length.

SUMMARY OF THE INVENTION

It is an object, therefore, of the present invention to improve the disadvantages and limitations of a prior art convolutional encoding system with sequential decoding by providing a new and improved forward error correction decoding system.

It is also an object of the present invention to provide an error correction decoding system which decodes in a short time with a simple apparatus, even when a channel condition is poor.

The above and other objects are attained by a syndrome sequential decoding system comprising: an input terminal for accepting a received sequence including both an information bit and a parity bit; an input/output (I/O) buffer memory for storing a received information sequence; a syndrome former connected to the input terminal for generating a syndrome sequence as a product of a received sequence and the parity check matix of the convolutional code; an estimated error buffer memory for storing the estimated error sequence; a syndrome buffer memory connected to the output of the syndrome former; a decoding pointer for retrieving and storing the bits in the syndrome buffer memory; a syndrome register for processing a new syndrome state; a comparator coupled with the syndrome register for testing if content of the syndrome register is all zero; an algorithm controller for finding out a position of an error bit according to content of the syndrome register and the comparator, and inverting a bit in the estimated error buffer memory when an error bit is located; a back search limit pointer coupled slidably with the estimated error buffer memory for restricting the decoding pointer not to go beyond a bit position defined by the back search limit pointer; an exclusive-OR circuit coupled with output of the input buffer memory and output of the estimated error buffer memory for inverting output bit of the input/output buffer memory according to an output of the estimated error buffer memory; and an output terminal coupled with the exclusive-OR circuit for providing an error corrected decoded output sequence.

BRIEF DESCRIPTION OF DRAWINGS

FIG. 4(a) shows an embodiment of an encoder which is a realization of a generator matrix at a transmitting end. FIG. 4(b) shows a syndrome former, and FIG. 4(c) shows a syndrome register.

DESCRIPTION OF THE PREFERRED EMBODIMENTS

Figure 1:
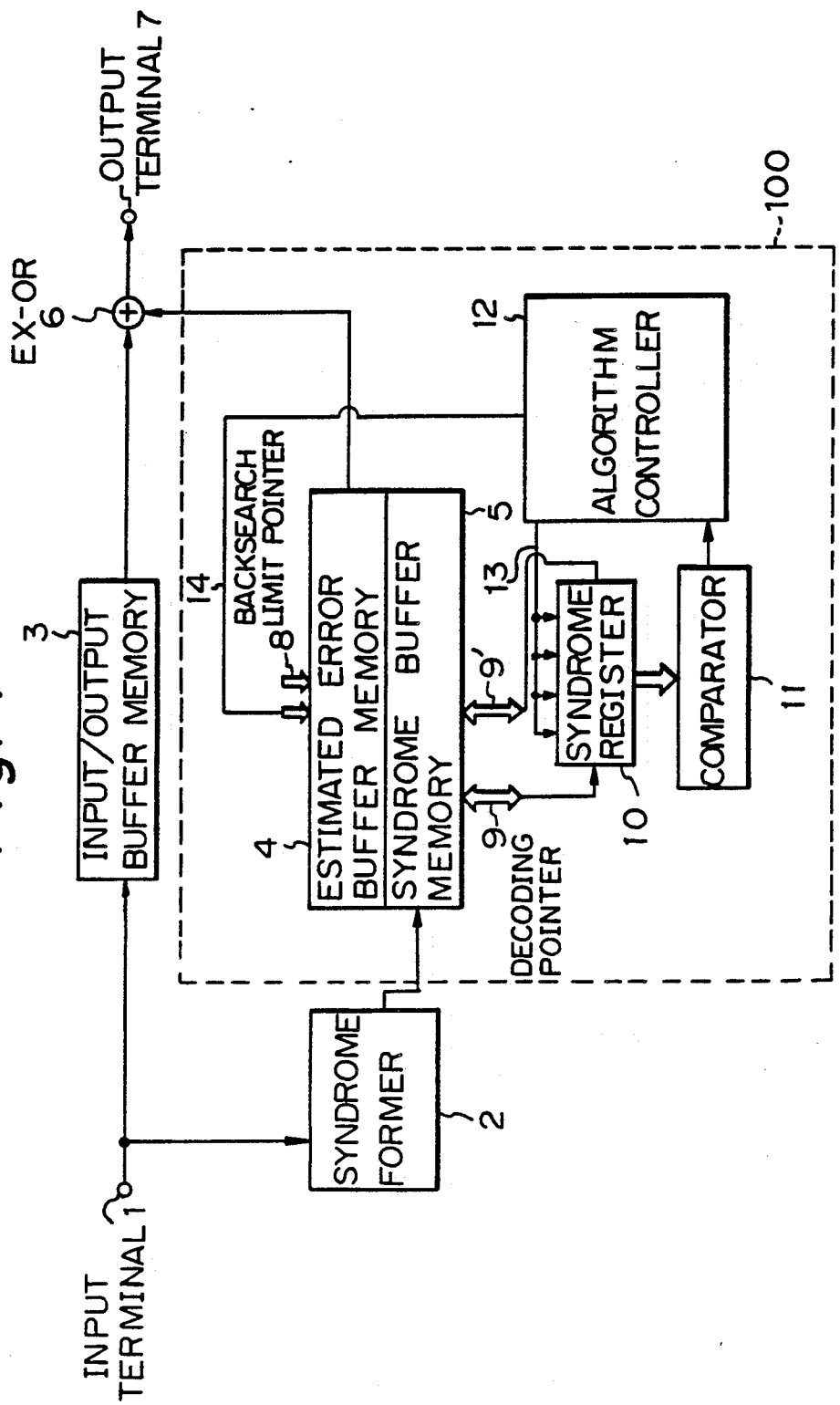
FIG. 1 shows a block diagram of the decoder according to the present invention, which operates with the syndrome sequential decoding based upon a Fano algorithm.

FIG. 1 shows a block diagram of the decoder according to present invention, which operates with the syndrome sequential decoding based upon a Fano algorithm. It is assumed that systematic convolutional code is used. The systematic code has the feature that the original information data itself as contained in the encoded sequence.

In the figure, the numeral 1 is an input terminal for accepting a received sequence including both an information bit and a parity bit, 2 is a syndrome former which generates the syndrome sequence as a product of the received sequence and a parity check matrix, 3 is an input/output (I/O) buffer memory which stores temporarily the received information sequence, 4 is an estimated error buffer memory for storing the estimated information error sequence, 5 is a syndrome buffer memory for storing the syndrome sequence which is originally generated in the circuit 2, 6 is an exclusive-OR circuit (EX-OR) for correcting the error in the output of the buffer memory 3 according to the output of the error correction buffer memory 4 by inverting the code (1 or 0) of the output of the buffer memory 3 according to the output of the correction buffer memory 4, 7 is an output terminal for providing a decoded sequence, 8 is a backsearch limit pointer which determines the backsearch limit of a Fano algorithm search. The numerals 9 and 9' are decoding pointers for retrieving and storing the bits in the syndrome buffer memory 5 so that the new syndrome state is processed by a syndrome register 10, which performs a syndrome reset for error correction. The numeral 11 is a comparator which tests if the content of the syndrome register 10 is completely zero (0), 12 is an algorithm controller for controlling the operation of the syndrome register 10 and the estimated error buffer memory 4, 13 is a reset signal for initiating the syndrome reset in the register 10, 14 is a pointer to put an estimated error into the estimated error buffer 4, and 100 is a, syndrome sequential decoder having the members 4, 5, and 8 through 12.

In operation, the received sequence is fed to the input terminal 1, and through the input terminal 1 to the syndrome former 2, which generates the syndrome sequence as a product of the received sequence and the parity check matrix. The syndrome thus generated is fed to the syndrome buffer memory 5. The information bit in the received sequence is fed to the input/output buffer memory 3.

In a Fano algorithm, a state of each node under search is stored in the syndrome register 10. Whenever the decoder chooses one branch from the node, a syndrome at the pointer 9 is retrieved from the syndrome buffer memory 5. A syndrome reset is done by the reset signal 13 from the algorithm controller 12 according to the error estimation so as to make the output of the syndrome register zero. If the output is initially zero, a syndrome reset is not done. A branch metric is calculated from the result of the syndrome reset. The path metric is updated by adding this branch metric. If the path metric increases by choosing a certain branch, the pointers 9 and 9' are moved forward in steps (in the left direction in the drawing). On the other hand, if the path metric decreases by choosing a branch, the decoder selects another branch. If there remains no branch to select, the decoder moves the pointers 9 and 9' to the right for backsearching.

The comparator 11, which tests if the content of the syndrome register 10 is completely zero or not, is an important feature of the present invention. When it is found that the content of the syndrome register 10 is completely zero, the algorithm controller 12 moves the backsearch limit pointer 8 to a position just behind a current decoding pointer 9', so that the further backsearch beyond this limit is forbidden.

When the all zero syndrome state is detected, the algorithm controller 12 monitors only the succeeding syndrome, and as far as the content of the syndrome register 10 is zero, it moves all the pointers forward by one step, and the bit zero is written in the estimated error buffer memory 4 through the error bit pointer 14. The zero bit in the estimated error buffer memory 4 indicates that there is no error.

As mentioned above, when the content of the syndrome register 10 is zero, no path search is essentially carried out since it means that the current path merges with a maximum likelihood path. When the incoming syndrome is not zero (that shows the presence of some errors), the correct path search operation restarts under the control of the algorithm controller 12. Therefore, by the detection of the all zero state of the syndrome register 10, the decoded bits up to this point are explicitly determined without further path search. This features leads to a significant reduction in the number of path searches. It is also expected that number of occurences of decoder overflow will be decreased, which improves overall bit error performance of the decoder.

Although the foregoing describes an embodiment using the systematic code, a non-systematic code is available in the present invention by installing an inverse circuit of an encoder in a decoder.

Figure 2:
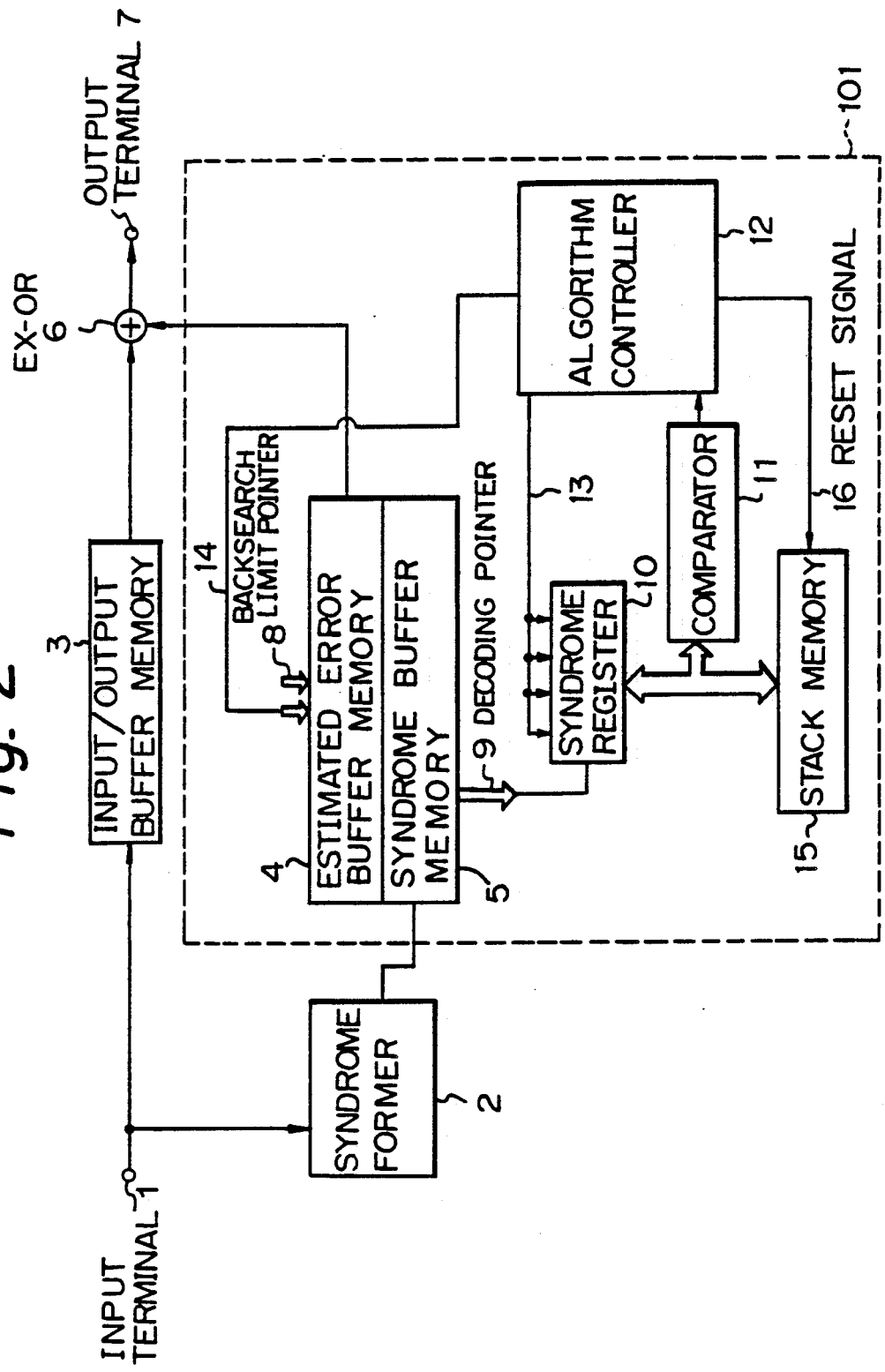
FIG. 2 shows a block diagram of another embodiment according to the present invention, in which a stack algorithm is used for sequential decoding.

FIG. 2 shows a block diagram of another embodiment according to the present invention, in which a stack algorithm is used for sequential decoding. The same numerals as those in FIG. 1 show the same elements, and the numeral 101 is a decoder with a stack algorithm, 15 is a stack memory which stores states of the nodes provided by the syndrome register 10 according to their path metrics, and 16 is a reset signal for the stack memory 15.

The state of the node newly generated by the syndrome register 10 is sent to the stack memory 15 and stored in it according to its path metric order. Next, the state of the node which has the highest path metric is read out of the stack memory 15, and is sent to the syndrome register 10. Then, the decode pointer 9 is positioned according to the depth of the node and the syndrome at this point is fed to the syndrome register 10. The state of the next node is generated from the state of the parent node and the syndrome by an appropriate syndrome reset at the syndrome register 10. Finally the state of the new node is sent to the stack memory. The above operation is repeated.

When the node with the highest path metric is read out of the stack memory 15, the comparator 11 tests if the state of the node is all zero or not. If the state is all zero, this fact is conveyed to the algorithm controller 12, which sends the reset signal 16 to the stack memory 15, so that the content of the stack memory 15 are immediately cleared and no nodes for searching exist in the stack memory 15.

In this case, the algorithm controller 12 stops the path search, including the transfer of the node between the syndrome register 10 and the stack memory 15, and moves the pointers 8 and 9 forward by one step until the non-zero syndrome enters into the syndrome register 10. Then the decoding operation (path search operation) restarts.

As mentioned above, the embodiment of FIG. 2 has the feature that when the status of the syndrome register 10 is zero, the contents of the stack memory are cleared, and no path search operation is carried out insofar as the succeeding syndrome remains zero. Therefore, the stack memory can be used very efficiently so that the probability of stack memory overflow is significantly decreased, which leads to the improvement of overall decoding performance.

Figure 3:
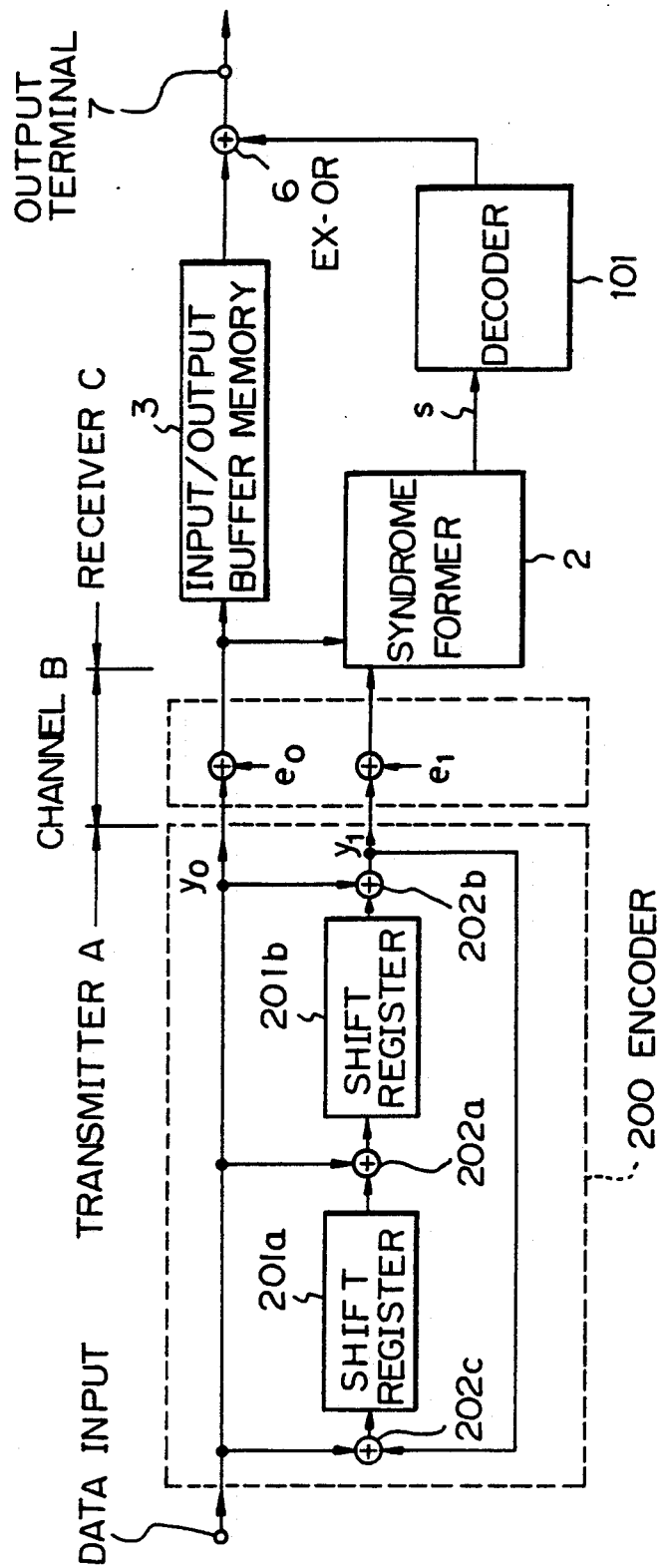
FIG. 3 shows a block diagram of still another embodiment according to the present invention.

FIG. 3 shows a block diagram of still another embodiment according to the present invention. In the figure, the symbol A is a transmitter, B is a channel, and C is a receiver. The structure of the portion C may be the same as either that of FIG. 1 or FIG. 2.

In the transmitter A, the convolutional code is generated by the encoder 200 which has the shift registers 201a and 201b, the exclusive-OR circuits 202a and 202b and 202c, and an internal feedback from the output of the exclusive-OR circuit 202b to the input of the exclusive-OR circuit 202c. The error sequences $e_0$ and $e_1$ are added to the encoded sequence on the channel B.

The embodiment of FIG. 3 shows that the present invention is applicable to a systematic convolutional code which has an internal feedback. It should be noted that a systematic convolutional code with an internal feedback loop can achieve the same free distance as an optimum nonsystematic code. It should be also noted that a continuous mode encoding/decoding is assumed in this embodiment of the system. In this case, decoding of such a class of codes becomes difficult. The present invention provides a simple decoding system for a feedback convolution code.

In FIG. 3, the generator polynominal of the encoder 200 is $G(D)=[1,(1+D+D^2)/(1+D^2)]$, and the generator polynominal of the syndrome former 2 is $H^T(D)=[1+D+D^2, 1+D^2]$ where the relations $GH^T=0$ are satisfied.

Table 1 shows the operation of the encoder and the syndrome former when no error occurs, in which it is assumed that the initial state of the syndrome former 2 is 00. The information sequence sent to the input terminal is 1,0,1,0,0,1, . . . and the encoded sequence is 11,00,11,01,00,10, . . . (information sequence is 1,0,1,0,0,1, . . . and parity sequence is 1,0,1,1,0,0, . . .). The syndrome former 2 generates an all zero syndrome sequence after $t=2$. This means that the initial unknown state of the syndrome former 2 is removed at $t=2$. After $t=2$, the output of the syndrome former 2, or the input of the decoder 101, remains zero insofar as no error occurs in the channel B.

TABLE 1

|  | Initial | t=1 | t=2 | t=3 | t=4 | t=5 | t=6 |
|---|---|---|---|---|---|---|---|
| State of encoder 200 | 10 | 00 | 00 | 01 | 10 | 01 | 11 |
| input data |  | 1 | 0 | 1 | 0 | 0 | 1 |
| Output to channel B |  | 11 | 00 | 11 | 01 | 00 | 10 |
| Information error |  | 0 | 0 | 0 | 0 | 0 | 0 |
| Parity error |  | 0 | 0 | 0 | 0 | 0 | 0 |
| Input to syndrome former 2 |  | 11 | 00 | 11 | 01 | 00 | 10 |
| State of syndrome former 2 | 00 | 01 | 00 | 01 | 10 | 10 | 11 |
| Output syndrome |  | 0 | 1 | 0 | 0 | 0 | 0 |

The table 2 shows a similar case to that of the table 1, but here it is assumed that one information bit error occurs in the transmission line B at $t=3$. The syndrome generator 2 provides the error pattern $1+D+D^2$ relating to a bit position of an error, instead of 0. In this case, the error pattern $1+D+D^2$ which starts at $t=3$ is added to the generated syndrome sequence so that the output syndrome becomes 0,1,1,1,1,0. . . When there is an error in a parity bit, an error pattern $1+D^2$ is added on the syndrome sequence.

Therefore, in the table 2, consecutive 1's from $t=2$ to $t=5$ appear in the the output syndrome in which the state of the encoder 200 does not coincide with that of the syndrome former 2. However, those states coincide with each other after $t=5$.

TABLE 2

|  | Initial | t=1 | t=2 | t=3 | t=4 | t=5 | t=6 |
|---|---|---|---|---|---|---|---|
| State of encoder 200 | 10 | 00 | 00 | 01 | 10 | 01 | 11 |
| input data |  | 1 | 0 | 1 | 0 | 0 | 1 |
| Output to channel B |  | 11 | 00 | 11 | 01 | 00 | 10 |
| Information error |  | 0 | 0 | 1 | 0 | 0 | 0 |
| Parity error |  | 0 | 0 | 0 | 0 | 0 | 0 |
| Input to syndrome former 2 |  | 11 | 00 | 01 | 01 | 00 | 10 |
| State of syndrome former 2 | 00 | 01 | 00 | 10 | 11 | 01 | 11 |
| Output syndrome |  | 0 | 1 | 1 | 1 | 1 | 0 |

The output of the syndrome former 2 is fed to the decoder 101, which operates on the syndrome sequential decoding algorithm. In this decoder, this output syndrome sequence is stored in a syndrome buffer and an appropriate syndrome reset is made at the syndrome register in the decoder 101 so as to make all of the reset output zero. A branch metric is calculated according to the result of the reset. Thus the syndrome sequential decoder searches the path (the error sequence) with the largest path metric.

It should be appreciated that the present invention is applicable to a systematic code with any coding rate, although the embodiment concerns a code with a coding rate of ½.

As mentioned above, the present invention is useful for decoding a systematic code which is encoded through an encoder with an internal feedback.

FIG. 4(a) shows an embodiment of an encoder which is a realization of a generator matrix at a transmitting end (not shown), FIG. 4(b) shows a syndrome former 2, and FIG. 4(c) shows a syndrome register 10. In those figures, the symbol D shows a delay circuit with a delay time of one clock time, and E is an exclusive-OR circuit.

In FIG. 4(a), the generator matrix in this encoder is $[1,1+D^2]$. Since this is a systematic code, one output information bit is directly connected to the input, and the parity bit is generated through the circuit of FIG. 4(a). The coding rate in this case is ½, since each input information bit generates two output bits.

At a receiving end, the information bit and the parity bit are fed to the syndrome former 2 (FIG. 4(b)), which generates the syndrome. The generator matrix of the syndrome former is $[1+D^2, 1]^T$.

The syndrome register 10 (FIG. 4(c)) receives a syndrome from the syndrome buffer register 5, and the reset 0 signal and the reset 1 signal from the algorithm controller 12. The reset 0 signal resets the contents of the register 10 with a polynomial $(1+D^2)$ which corresponds to an information bit error estimation, and the reset 1 signal inverts the content of the register 10 with a polynominal (1) which corresponds to a parity bit error estimation.

The algorithm controller 12 searches the correct path by extending two branches. When the rightmost bit in the syndrome register is zero, the algorithm controller extends a branch by (1) no reset and it also extends the other branch by (2) reset by both the polynomial $(1+D^2)$ and the polynomial (1). The case (1) means that no channel error is presumed and cases (2) means that the occurrence of both a parity error and an information error is presumed. In both cases, the output of the bit from the syndrome register is zero.

On the other hand, when the rightmost bit in the syndrome register is 1, the algorithm controller extends a branch by the (3) reset by polynomial $(1+D^2)$ and it also extends the other branch by the (4) reset by polynomial (1). The cases (3) means that the occurrence of an information error is presumed and the case (4) means that the occurrence of a parity error is presumed. As in the previous cases (1) and (2), the output bit from the syndrome register is zero.

Whenever the reset signal 0 is sent from the algorithm controller, the estimated information error is stored in the estimated error buffer. Further decoder operation will proceed according to its basic algorithm either by a Fano or a stack algorithm.

As mentioned above, according to the present invention, when the content of the syndrome register is zero, the decoded path up to this point is determined. Therefore, since no further path search is required for the previous branches, amount of the calculation for error correction operation is reduced, and the probability of decoder overflow is decreased.

Further, the path search operation stops until a nonzero syndrome is fed to the syndrome register. Therefore, the efficiency of the decoding is further improved.

Further, since the present invention is applicable to the decoding of a feedback systematic convolutional code, the largest free distance is achieved if the code constraint length is constrained to be constant and is also constrained to be systematic.

Therefore, the present invention is advantageous for improving the bit error performance.

From the foregoing, it will now be apparent that a new and improved decoding system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A syndrome sequential decoding system for decoding a received code word sequence which is convolutionally encoded, comprising:
   an input terminal for receiving the received code word sequence which is convolutionally encoded, said received code word sequence including an information bit and a parity bit;
   an input/output buffer memory for storing data representing said received code word sequence;
   a syndrome former means coupled to receive said received code word sequence from said input terminal, for generating a syndrome sequence which is a product of the received code word sequence and a parity check matrix of said convolutional code;
   an estimated error buffer memory for indicating an estimated channel error sequence;
   a syndrome buffer memory coupled with the output of said syndrome former means, for storing said output of said syndrome former means;
   a syndrome register coupled to said syndrome buffer memory for storing data representing a new syndrome state;
   shifting means for receiving bits from said syndrome buffer memory and storing said bits in said syndrome register, said shifting means including a decoding pointer which is shiftable to indicate one of a plurality of syndromes in said syndrome buffer memory;
   a comparator means coupled with the output of said syndrome register for testing whether or not the contents of said syndrome register are all zero;
   an algorithm controller coupled to receive the output of said comparator means for determining, in event of detection of an error, a position of an error bit and for producing a signal indicative of said position of said error bit, said algorithm controller being coupled to said estimated error buffer memory for inverting a bit located at said position of said error bit in said estimated error buffer memory in the event of detection of an error;
   a back search limit pointer which is shiftable to specify one of a plurality of different bit positions in said estimated error buffer memory, for restricting said decoding pointer so that it does not go beyond a bit position specified by said back search limit pointer;
   an exclusive-OR circuit coupled to receive the output of said input/output buffer memory and the output of said estimated error buffer memory for inverting an output bit of the output of said input/output buffer memory depending upon the output of said estimated error buffer memory; and
   an output terminal coupled to an output of said exclusive-OR circuit for supplying an error corrected decoded output sequence.

2. A syndrome sequential decoding system according to claim 1, wherein said shifting means further comprises stack memory means coupled with said syndrome register for storing information including the state of said syndrome register and for sending said information to said syndrome register in response to a request by said algorithm controller means.

3. A syndrome sequential decoding system according to claim 1, wherein said comparator sends a signal to said algorithm controller if said contents of said syndrome register are all zero, and said stack memory is cleared by a signal from said algorithm controller.

4. A syndrome sequential decoding system according to claim 2 or claim 3, wherein said algorithm controller operates for error correction only when said contents of said syndrome register are not zero.

5. A syndrome sequential decoding system according to claim 1, wherein said received code word sequence is encoded by a convolution code system having a feedback loop, said convolution code system having an encoder having delay circuits, exclusive-OR circuits alternatingly coupled in series with said delay circuits, and a feedback loop between an output of a downstream one of said exclusive-OR circuits and an input of an upstream one of said exclusive-OR circuits.

6. A syndrome sequential decoding method using a tree structure of a convolutional code, comprising the following steps:
   receiving at an input terminal a received sequence which was encoded by the convolutional code;
   storing an information sequence derived from said received sequence in an input/output buffer;
   supplying said received sequence to a syndrome former and using said syndrome former to prepare a syndrome sequence from said received sequence;
   storing said syndrome sequence in a syndrome buffer;
   determining a path which has the largest path metric by performing the following steps:
   retrieving a syndrome from said syndrome buffer at a searching point;

supplying said syndrome to a syndrome register;
generating a new state of said syndrome register from both a previous state of said syndrome register and from a succeeding syndrome by performing a resetting operation on said syndrome register;
monitoring the state of said syndrome register;
raising an error flag in an estimated error buffer which stores an estimated information error sequence if the state of said syndrome register is indicative of occurrence of an information error;
calculating a branch metric according to the result of the resetting operation performed on said syndrome register;
updating a path metric of a current searching path by adding said branch metric to a previously calculated path metric;
determining, in response to the updated path metric, whether to continue a forward search or to start a back search; determining a decoded path up to a current searching point when said previous state of said syndrome register becomes all zero;
determining a decoded path if said previous state of said syndrome register does not become all zero beyond the predetermined backsearch limit; and
correcting errors of said information sequence responsive to the determined decoded path.

7. A syndrome sequential decoding method using a tree structure of a convolutional code, comprising the following steps of:
receiving at an input terminal a received sequence which was encoded by the convolutional code;
storing an information sequence derived from said received sequence in an input/output buffer;
supplying said received sequence to a syndrome former and using said syndrome former to prepare a syndrome sequence from said received sequence;
storing said syndrome sequence in a syndrome buffer; and
determining a path which has the largest path metric by performing the following steps:
retrieving a syndrome from said syndrome buffer at a searching point;
supplying said syndrome to a syndrome register;
generating a new state of said syndrome register from both a previous state of said syndrome register and from a succeeding syndrome by performing a resetting operation on said syndrome register;
monitoring the state of said syndrome register;
raising an error flag in an estimated error buffer which stores an estimated information error sequence if the state of said syndrome register is indicative of occurrence of an information error;
calculating a branch metric according to the result of the resetting operation performed on said syndrome register;
updating a path metric of a current searching path by adding said branch metric to a previously calculated path metric;
determining, in response to the updated path metric, whether to continue a forward search or to start a back search; determining a decoded path up to a current searching point when said previous state of said syndrome register becomes all zero, stopping said resetting operation, raising an error flag and continuing calculation of said branch metric until a non-zero syndrome exists in said syndrome register, while determining a decoded path having no determined error; determining a decoded path beyond a predetermined backsearch limit when said previous state of said syndrome register does not become all zero; and correcting errors of said information sequence responsive to the determined decoded path.

8. A syndrome sequential decoding method for decoding an information sequence which is encoded at a transmitting end by a systematic convolutional encoder which contains internal feedback, the encoded information sequence being transmitted to a receiving end to be decoded, comprising the following steps:
receiving at an input terminal a received sequence which was encoded by the systematic convolutional encoder;
storing an information sequence derived from said received sequence in an input/output buffer;
supplying said received sequence to a syndrome former and using said syndrome former to prepare a syndrome sequence from said received sequence;
storing said syndrome sequence in a syndrome buffer; and
determining a path which has the largest path metric by performing the following steps:
retrieving a syndrome from said syndrome buffer at a searching point;
supplying said syndrome to a syndrome register;
generating a new state of said syndrome register from both a previous state of said syndrome register and from a succeeding syndrome by performing a resetting operation on said syndrome register;
monitoring the state of said syndrome register;
raising an error flag in an estimated error buffer which stores an estimated information error sequence if the state of said syndrome register is indicative of occurrence of an information error;
calculating a branch metric according to the result of the resetting operation performed on said syndrome register;
updating a path metric of a current searching path by adding said branch metric to a previously calculated path metric;
determining, in response to the updated path metric, whether to continue a forward search or to start a back search;
determining a decoded path up to a current searching point when said previous state of said syndrome register becomes all zero, stopping said resetting operation, raising an error flag and continuing calculation of said branch metric until a non-zero syndrome exists in said syndrome register, while determining a decoded path having no determined error;
determining a decoded path beyond a predetermined backsearch limit when said previous state of said syndrome register does not become all zero; and
correcting errors of said information sequence responsive to the determined decoded path.

9. A syndrome sequential decoding method for decoding an information sequence which is encoded at a transmitting end by a systematic convolutional encoder which contains internal feedback, the encoded information sequence being transmitted to a receiving end to be decoded, comprising the following steps:
receiving at an input terminal a received sequence which was encoded by the convolutional code;
storing an information sequence derived from said received sequence in an input/output buffer;

supplying said received sequence to a syndrome former and using said syndrome former to prepare a syndrome sequence from said received sequence;

storing said syndrome sequence in a syndrome buffer; and determining a path which has the largest path metric by performing the following steps:

retrieving a syndrome from said syndrome buffer at a searching point;

supplying said syndrome to a syndrome register;

generating a new state of said syndrome register from both a previous state of said syndrome register and from a succeeding syndrome by performing a resetting operation on said syndrome register;

raising an error flag in an estimated error buffer which stores an estimated information error sequence if said decoder is thinking of said occurrence of an information error;

calculating a branch metric according to said resetting operation;

updating a path metric of current searching path by adding said branch metric to said previous path metric;

whether to continue a forward search or to start a back search;

determining a decoded path beyond a predetermined backsearch limit; and correcting errors of said information sequence responsive to the determined decoded path.

* * * * *